United States Patent [19]

Davies

[11] 4,393,369

[45] Jul. 12, 1983

[54] FLOATING-POINT A/D AND D/A CONVERTER

[75] Inventor: Kirk E. Davies, San Diego, Calif.

[73] Assignee: The United States of America as represented by the Secretary of the Navy, Washington, D.C.

[21] Appl. No.: 243,985

[22] Filed: Mar. 16, 1981

[51] Int. Cl.³ .............................................. H03K 13/02
[52] U.S. Cl. ......................... 340/347 AD; 340/347 M; 367/67
[58] Field of Search ................. 340/347 AD, 347 DA; 367/65–67

[56] References Cited

U.S. PATENT DOCUMENTS 3,673,398  6/1972  Loffbourrow .......... 340/347 DA X
4,240,070 12/1980  Helbig et al. ................. 340/347 DA

OTHER PUBLICATIONS

Timko et al., 12–Bit Successive Approximation A/D, Electronic Design 20, Sep. 27, 1978, pp. 68–76.
The Engineering Staff of Analog Devices, Inc., Analog–Digital Conversion Handbook, 6/1972, pp. III–5 to III–9.

Primary Examiner—T. J. Sloyan
Attorney, Agent, or Firm—Robert F. Beers; Ervin F. Johnston; Thomas Glenn Keough

[57] ABSTRACT

This improves the digitizing of analog signals over a wide dynamic range for a floating point decimal conversion. The widely fluctuating input analog voltages are converted to currents to prevent saturation of circuit elements and are, first, compared with a derived reference signal to produce positive voltages or negative voltages if the input signal exceeds or is less than the derived reference current. The positive and negative voltages are fed to a combined floating point processing unit and microprocessor which generates two groups of digital signals. The first group is representative of m mantissa increments and the second group of n signals is indicative of the order of magnitude of the mantissa components. A mantissa digital-to-analog current generator and an order of magnitude digital-to-analog current generator are coupled in series with respect to each other to provide the derived reference current which is to be compared with the next sample of the input analog signal. Since the derived reference current is derived in the immediately preceding sample period, the newly sampled analog signal is compared as being greater or lesser with a still newer input sample. The first group of digital signals indicative of the mantissa increments and the second group of digital signals indicative of the order of magnitude are fed onto following circuitry to allow for example, a visual readout or further processing. The floating point analog-to-digital conversion has the great advantage over linear, analog arithmetic conversion by being able to handle large dynamic ranges of analog input signals.

2 Claims, 5 Drawing Figures

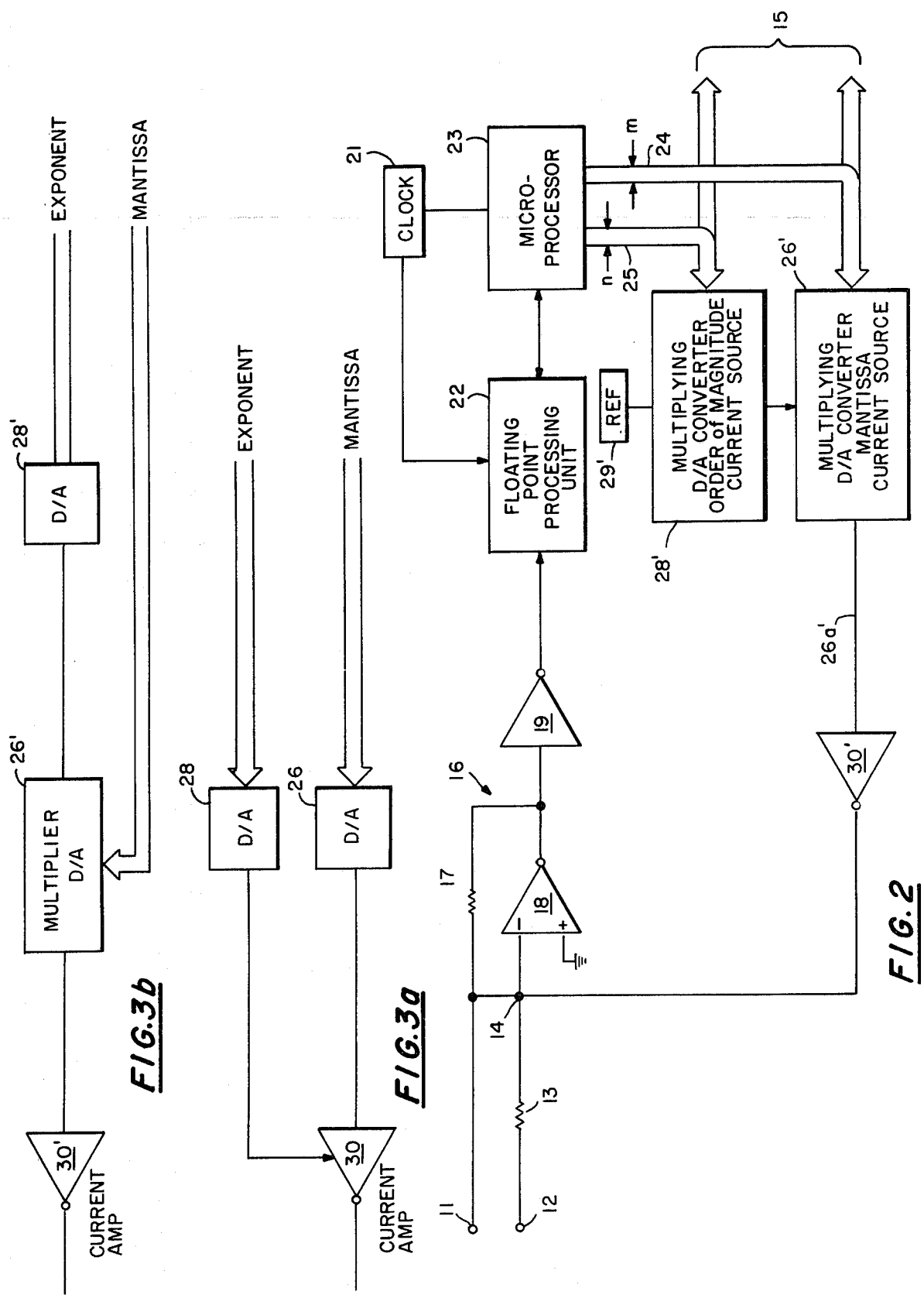

FLOATING-POINT A/D AND D/A CONVERTER

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION

Numerous conversion systems have been developed over the years which convert analog signals to representative digital words. The coding schemes are many and varied and the steady progression takes advantage of the latest technological advances. Advances in integrated circuitry and related fabrication techniques give designers the necessary tools to achieve a good many goals which heretofore were only theoretically predicted. Switching times, memory capacities, bandwidths and a host of compilations and processes now are commonplace.

A system using the delta digitizing technique is one of the processes by which speech or similar analog signals are converted into a serial bit stream. Generally speaking, an analog-to-digital system creates digital words which represent the value of the original input analog signals. Unfortunately, wide dynamic excursions of the input analog signals cannot be responsively followed in the digital and analog conversions and information may be lost due to saturation of linear circuits. In addition, conventional displays and processing equipments may be unable to accommodate the additional bits of data that widely fluctuating analog signals create or might create. Numerous efforts have been attempted to accommodate the widely fluctuating signals and to compress their representative digital data signals.

The output from a spectrophotometer was hoped to be accommodated by a circuit arrangement diclosed by Adrian Frances Flynn et al in U.S. Patent and Trademark Office U.S. Pat. No. 3,995,265. In their approach, a comparison with an accumulation of a reference signal allowed processing of analog signals. This represents a meritorious advance in the state-of-the-art; however, it appears to be somewhat limited for it relies on a linear approach as opposed to a more accommodating, floating point conversion. William George Prowse discloses a modulator in a delta modulation system in his U.S. Patent and Trademark Office U.S. Pat. No. 4,110,705. The rapidly changing input voltages produced by high frequencies and/or large amplitudes are inadequately tracked between an accumulator value and an instantaneous analog signal input by a technique generally referred to as companding. In his system the effects of random or low level noise are reduced and modified step sizes are used to reduce the problems normally associated with the analog-to-digital and digital-to-analog conversions.

Thus, there is a continuing need in the state-of-the-art for an apparatus which can accommodate wide dynamic range analog input signals having a floating point decimal conversion to produce digital information in usable form by associated components such as readouts and microprocessors.

SUMMARY OF THE INVENTION

The present invention is directed to providing an apparatus for producing digital signals indicative of a floating decimal point representation of widely ranging input analog signals. A means is coupled to receive the input analog signals for assuring that the input analog signal is an input analog current signal. Means are coupled to the analog current signal assuring means for comparing the analog current signal with a derived reference signal to produce a positive voltage if the analog current signal exceeds the derived reference signal and a negative voltage if the analog current signal is less than the derived reference signal. A means is coupled to the comparing means for generating logic signals representative of a positive voltage or a negative voltage depending on whether or not the input analog signal is above or below the magnitude of the derived reference signal. A means is coupled to the generating means for providing a first group of digital signals indicative of m mantissa increments and a second group of signals indicative of increments equal to an n order of magnitude. A first means is coupled to the providing means for converting the first group of mantissa digital signals to a mantissa component of the derived reference signal and a second means is coupled to the providing means for converting the second group of order of magnitude digital signals to an order of magnitude component of the derived reference signal. A means is coupled to the first and second converting means for multiplying the mantissa component by the order of magnitude component to produce the derived reference signal for feeding the derived reference signal to the comparing means to effect the afore-referred-to comparing.

A prime object of the invention is to provide an improvement for converting analog signals and expediting processing.

Yet another object is to provide an improvement which enables digital and analog conversion.

Another object is to provide for digitizing widely fluctuating input signals.

Another object is to provide for widely fluctuating voltages and currents to assure representative digital signals.

Still another object of the invention is to provide an apparatus capable of generating a floating point decimal digital representation of a widely fluctuating input analog signal.

Another object is to provide a floating point digital-to-analog converter.

Yet a further object is to provide for the comparison of currents within acceptable ranges to avoid saturation of components.

Still another object is to provide an apparatus for producing a floating point digital representation by a mantissa group of digital signals and an order of magnitude group of digital signals.

These and other objects, advantages and novel features of the invention will become apparent from the following detailed description of the invention when considered in conjunction with the accompanying drawings.

BRIEF DESCRIPTION OF THE DRAWINGS

FIG. 2 is a schematic representation of an alternative form of this invention.

FIG. 3 is a schematic of a digital-to-analog floating point converter. The embodiment of Fig. 3a employs two D/A converters; that of Fig. 3b, a single, multiplexed D/A converter.

DESCRIPTION OF THE PREFERRED EMBODIMENT

Figure 1:
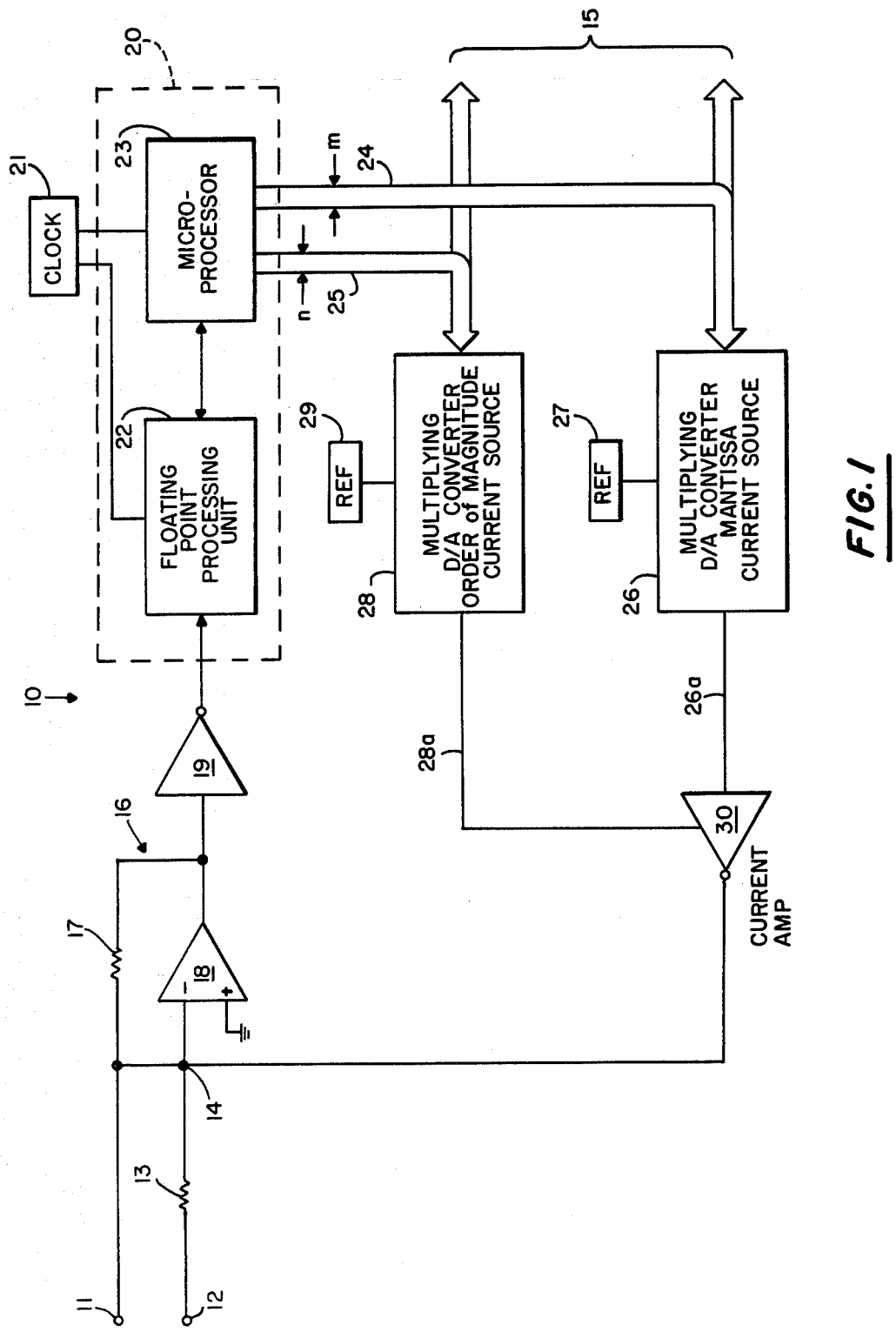
FIG. 1 is a schematic representation of an illustrative feature of this invention.

Looking to FIG. 1 of the drawings, a floating point converter 10 fabricated in accordance with the principles herein disclosed has the capability of converting widely fluctuating or high amplitude signals into representative digital signals. These wide dynamic range signals have created problems in contemporary conventional digitizing systems since high levels have shown a tendency to cause saturation among a variety of integrated circuit components.

An analog current input terminal 11 couples analog input currents and an analog voltage input terminal 12 is used when the widely fluctuating analog signals are voltage signals. A series resistor 13 converts the voltage signals into current signals so that they may be summed with a derived reference current at a summing node 14. More on the generation of the derived reference current will follow; however at this point let it suffice that the reference current enables the generation of the digitized floating point output at output terminal 15.

From the two input terminals, terminal 11 for current and terminal 12 for voltage, a comparator 16 compares the input signal current with the derived reference current. A feedback resistance loop 17 around an operational amplifier 18 performs the comparison function and produces a positive or negative voltage after the derived reference current and the input analog signal have been summed at node 14. The positive or negative voltages indicate whether the analog input current exceeds or is less than the derived reference signal.

When the analog input current rises above the derived reference current operational amplifier 18 of the comparator goes negative and inverter amplifier 19 coupled as a Schmidt trigger, interconnected to the comparator output, converts the negative voltage to a positive logic signal. In like manner, if the analog input current falls below the derived reference current the output of the operational amplifier functioning as a Schmidt trigger goes positive and inverter 19 creates an inverted logic level representative of the positive voltage. Usually these logic levels referred to are logical 1's or logical 0's.

The operational amplifier and its following inverter are standardized elements. As such, one skilled in the art is free to select based on their compatibility with other circuit elements as well as for the expected range of analog signals.

An arithmetic processor 20 is driven by a clock 21 that has the capability for initiating a series of sampling sequences. Typically the clock rate must be fast enough to enable extraction of all meaningful data from the analog signal without incurring slope distortion. The clock frequency typically is about five to ten megahertz. Recent advances in integrated circuitry allow much higher clocking rates and, as a result, the bandwidth of the input signals that the system can handle has increased considerably.

A floating point processing unit 22 within the arithmetic processor samples the positive or negative outputs from the inverter (logical 1 or a logical 0). The floating point processing unit will add a "one" least significant figure to the digital word representing the value of the input current if the logic input signal is positive and will subtract a "one" least significant figure from the digital word if the logic input signal is zero. A floating point processing unit manufactured by the Intel Corp. under the model designation 9232 is one of a number of representative units for incorporation in the floating point converter of this invention. The '9232 has single precision (32 bits) and double precision (64 bits) and can add, subtract, mulltiply and divide. The 9232's floating point arithmetic is a sub-set of the proposed IEEE Standard. It is easily interfaced to enhance the computational capabilities of the host microprocessor.

Information transfers between the floating point processing unit and its interconnected microprocessor 23 can be handled by using conventional I/O or direct memory access techniques. Such a programming and data handling capability is routinely implemented by those skilled in the art to which this invention pertains so that responsive trains of data are generated when a logical 1 or a logical 0 appears at its input and an appropriate clocking signal is received from interconnected clock 21.

A microprocessor 23 of the type desirable for use in the floating point comparator receives the digital signals from the floating point processing unit and generates two words of digital data comprising the digital output value of the input current. These two words are fed to "m" mantissa output lines 24 and "n" order of magnitude output lines 25.

Microprocessors such as the Intel MCS-81, MCS-85 or MCS-86 are compatible with the 9232 floating point processing unit, mentioned above, to deliver two groups of digital signals, one representative of mantissa values of a range of the analog input signals and the other representative of an order of magnitude range of input analog signals. Whether or not the mantissa signals and the order of magnitude signals increase or decrease values for the input analog signals is determined by the logic sign, 0 or 1, received by floating point processing unit 22 from inverter 19. Conductors carrying the same information as the "m" lines and "n" lines are tapped from the m and n lines to carry the equivalent information to output terminal 15.

A first multiplying digital-to-analog converter current source 26 receives the mantissa digital signals over the m lines and generates representative current values. A reference potential source 27 is coupled to the mantissa current source to provide a reference for generating mantissa current values. One digital-to-analog converter available in the state-of-the-art and fully compatible with the described elements is the 8-bit high-speed multiplying digital-to-analog converter manufactured by Signetics Corp., and designated NE/SE 5009. This has a number of inputs which are coupled to the m lines and its reference potential leads are coupled to reference potential source 27 so that representative analog currents are fed to an analog output lead 26a.

Similarly, the multiplying digital-to-analog converter 28 provides an order of magnitude current source when appropriate signals are transferred to it from microprocessor 23 over the n lines 25. A suitably adjusted reference potential source 29 provides the proper potentials for operation of the order of magnitude current source so that current signals are provided at output lead 28a. The order of magnitude current source also can be fabricated from one or more of the NE/SE 5009 digital-to-analog coverter referred to above.

Both the mantissa current source and the order of magnitude current source essentially are mutliplied in current amplifier 30 to create the derived reference current from the mantissa current component and the order of magnitude current component. This multiplication is achieved by allowing the order of magnitude current to control the gain of the current amplifier. Current amplifiers of this type are many and varied in design and in widespread use in the art. The output, derived reference current, from the current amplifier 30 is added together at summing node 14. The derived reference current (the product of the mantissa current and the order of magnitude current) and the input analog signal are delivered to the comparator for a subsequent comparison with a new sample so that an updated floating-point digital word can be generated for rederivation of a reference current and for the transmitting of an updated floating point digital word from output terminal 15.

The floating point processing unit 22 and its associated microprocessor 23 can be combined as the arithmetic processor 20 if the need arises. A state-of-the-art desk top computer, such as the HP9845, can be suitably programmed by one skilled in the art to which this invention pertains to create the mantissa digital signals and the order of magnitude digital signals.

When digital signals representative of an increasing value are fed from the arithmetic processor 20 to the mantissa current source and the order of magnitude current source, the two current sources provide a derived reference current which is representative of the changing input current throughout the range. When the mantissa range has been exceeded, after m clocking pulses makes m analyses, microprocessor 23 updates the state of the signals fed over the n lines to the order of magnitude current source. Hereafter magnitudes represented by each mantissa increment will be amplified an additional factor of ten over that previously represented by the order of magnitude signal. Now, reference current change represents an order of magnitude multiple of the previous increments so that large fluctuations of the input current can be followed. The floating decimal point conversion assures high speed responsive operation over wide dynamic ranges with reduced distortion of the input analog signal as compared to some other methods.

A modified form of the invention is set forth in FIG. 2. Elements 11 through 25 are substantially identical to those described above; however, mantissa D/A current source 26' is referenced, not by a conventional reference voltage source, but rather by a voltage derived from the output of the order of magnitude D/A current source 28'. The mantissa and order of magnitude D/A current sources are substantially the same as described above but only the source 28' is coupled to a conventional reference voltage source 29'. Multiplication in source 26' is effected by the exponential voltage value coming from source 28' so that the product at lead 26a' represents the derived reference current for inverter 30'.

The circuitry used to convert the digital floating point word to the analog reference current for the comparator is a floating point D-to-A converter. Two forms are shown in FIGS. 3a and 3b and are employed in the embodiments of FIGS. 1 and 2.

Figure 4:
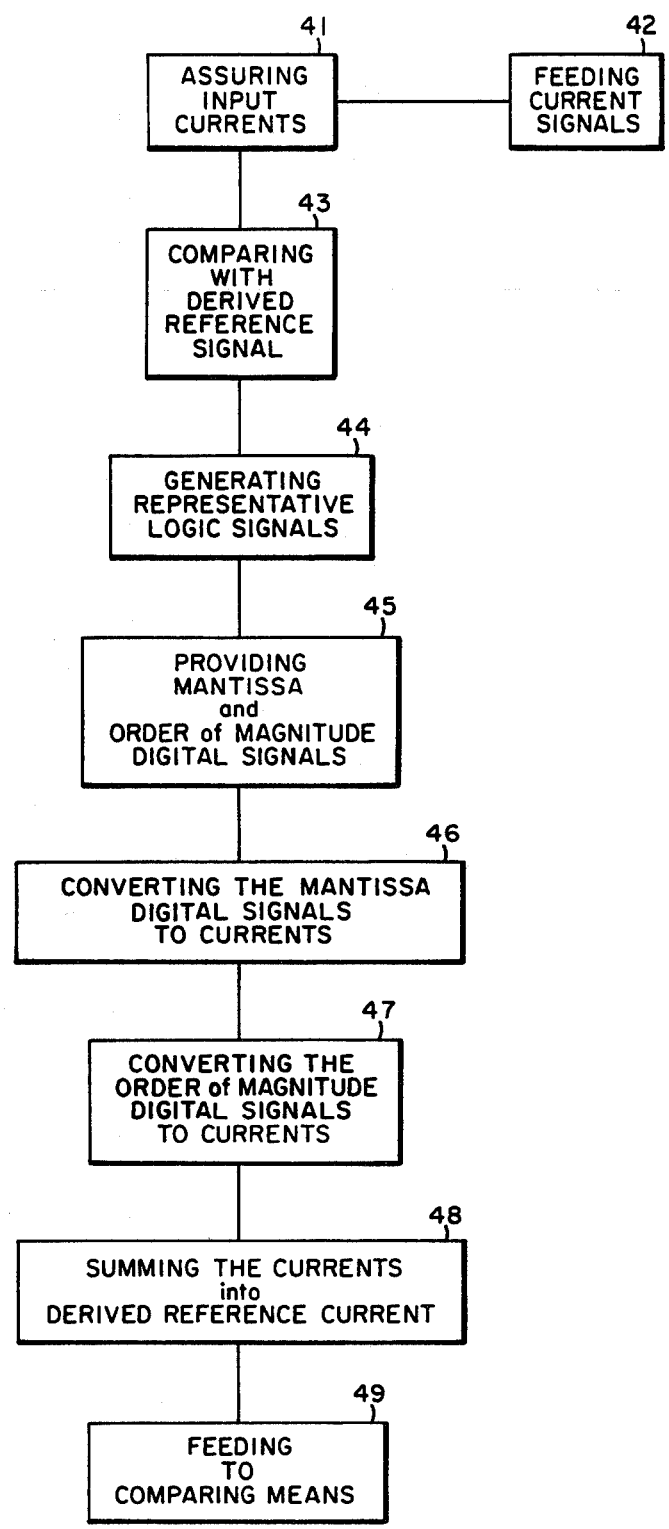
FIG. 4 depicts in block diagram form the method of the invention.

What has been described above is the apparatus of the invention which produces a floating point decimal signal representative of widely fluctuating input analog signals. The method of the invention set out in FIG. 4 provides an improved processing technique. First there is the assuring 41 of the input currents either by the coupling of an input analog voltage signal to a current resistor or a feeding 42 of current signals when the input analog information is a current. Next, there is the comparing 43 of the input analog signals with a derived reference signal and a generating 44 of a representative logic signal when the input analog signals are either greater than or less than the magnitudes of the derived reference signals. A providing 45 of mantissa and order of magnitude digital signals enables the transmission of the signals to a pair of digital-to-analog converters at which place a converting 46 of the mantissa digital signals and a converting 47 of order of magnitude signals to currents is made for a multiplying 48 of the currents into the derived reference current and a feeding 49 of the currents to the converting means.

After the derived reference current is generated the unit is ready for another derivation of a reference current when the clock enables the appropriate circuit elements.

Obviously many modifications and variations of the present invention are possible in the light of the above teachings. It is therefore to be understood that within the scope of the appended claims the invention may be practiced otherwise than as specifically described.

What is claimed is:

1. An apparatus for producing digital signals indicative of a floating decimal point representation of widely ranging input analog signals in a delta modulation servo loop comprising:

a serially connected resistor coupled to receive the input analog signals for assuring that the input analog signal is an input analog current signal;

an operational amplifier having a resistive feedback loop to produce a positive voltage and negative voltage coupled to the serially connected resistor for comparing the analog current signal with a derived reference signal to produce the negative voltage if the analog current signal exceeds the derived reference siangl and the positive voltage if the analog current signal is less than the derived reference signal, the derived reference current is subtracted from the input signal current therefore resulting in small currents and voltages for the system to operate on;

an inverter circuit coupled to the operational amplifier for generating a logic signal representative of a positive voltage and a logic signal representative of a negative voltage;

an interconnected floating point processing unit and microprocessor coupled to the inverter circuit for providing a first group of digital signals indicative of the mantissa and a second group of digital signals indicative of the order of magnitude;

a first high speed multiplying digital-to-analog converter coupled to a reference potential source and coupled to the providing means for converting the first group of mantissa digital signals to a mantissa component of the derived reference signal;

a second high speed multiplying digital-to-analog converter coupled to a reference potential source and coupled to the interconnected floating point processing unit and microprocessor for converting the second group of order of magnitude digital signals to an order of magnitude component of the derived reference signal;

means coupled to the first and second high speed multiplying digital-to-analog converters for multiplying the mantissa component and the order of magnitude component into the derived reference signal and for feeding the derived reference signal and input analog current signal to the comparing means;

means coupled to receive the first and second groups of digital signals for passing them to user components;

means for feeding in a current signal to the operational amplifier when the widely ranging input analog signals are current signals; and means for amplifying and inverting the derived reference current coupled between the outputs of the first and second high speed multiplying digital-to-analog converters and operational amplifier.

2. An apparatus for producing digital signals indicative of a floating decimal point representation of widely ranging input analog signals in a delta modulation servo loop comprising:

a serially connected resistor coupled to receive the input analog signals for assuring that the input analog signal is an input analog current signal;

an operational amplifier having a resistive feedback loop to produce a positive voltage and negative voltage coupled to the serially connected resistor for comparing the analog current signal with a derived reference signal to produce the negative voltage if the analog current signal exceeds the derived reference signal and the positive voltage if the analog current signal is less than the derived reference signal, the derived reference current is subtracted from the input signal current therefore resulting in small currents and voltages for the system to operate on;

an inverter circuit coupled to the operational amplifier for generating a logic signal representative of a positive voltage and a logic signal representative of a negative voltage;

an interconnected floating point processing unit and microprocessor coupled to the inverter circuit for providing a first group of digital signals indicative of the mantissa and a second group of digital signals indicative of the order of magnitude;

a first high speed multiplying digital-to-analog converter coupled to a reference potential source and coupled to the interconnected floating point processing unit and microprocessor for converting the first group of mantissa digital signals to a mantissa component of the derived reference signal;

a second high speed multiplying digital-to-analog converter coupled to a reference potential source and coupled to the interconnected floating point processing unit and microprocessor for converting the second group of order of magnitude digital signals to an order of magnitude component of the derived reference signal, the first high speed multiplying digital-to-analog converter is coupled to receive the voltage signals derived from the second high speed multiplying digital-to-analog converter and the second high speed multiplying digital-to-analog converter is coupled to a reference source of voltage;

means coupled to the first and second high speed multiplying digital-to-analog converters for multiplying the mantissa component and the order of magnitude component into the derived reference signal and for feeding the derived reference signal and input analog current signal to the comparing means;

means coupled to receive the first and second groups of digital signals for passing them to user components;

means for feeding in a current signal to the operational amplifier when the widely ranging input analog signals are current signals; and means for amplifying and inverting the derived reference current coupled between the outputs of the first and second high speed multiplying digital-to-analog converters and operational amplifier.

* * * * *